United States Patent [19]

Michaud

[11] Patent Number: 5,247,230
[45] Date of Patent: Sep. 21, 1993

[54] UNILATERAL DIAC FOR MOTOR SPEED CONTROL

[75] Inventor: Jan L. Michaud, Cuyahoga Falls, Ohio

[73] Assignee: Lucerne Products, Inc., Hudson, Ohio

[21] Appl. No.: 892,331

[22] Filed: Jun. 2, 1992

[51] Int. Cl.⁵ .............................. H01L 49/00
[52] U.S. Cl. .................................. 318/17; 437/6; 388/917; 388/937
[58] Field of Search ............... 437/6, 180, 250, 904, 437/906, 911; 388/917, 918, 919, 920, 937; 318/17

[56] References Cited

U.S. PATENT DOCUMENTS

| | | | |
|---|---|---|---|
| 3,708,720 | 1/1973 | Whitney et al. | 307/310 X |
| 4,056,408 | 11/1977 | Bartko et al. | 148/1.5 |
| 4,409,528 | 10/1983 | Podell | 318/729 X |
| 4,914,327 | 4/1990 | Dekker | 307/632 |
| 5,172,089 | 12/1992 | Wright et al. | 335/205 |

*Primary Examiner*—Bentsu Ro
*Attorney, Agent, or Firm*—Renner, Kenner, Greive, Bobak, Taylor & Weber

[57] ABSTRACT

A universal diac is provided for implementation in controlling an SCR in a motor speed control circuit. The diac is provided with dissimilar interconnections between the emitters and base, such that the device operates as a standard diac in one mode of operation, and as a zener diode in an opposite mode of operation. The zener characteristics are achieved by the implementation of a shorted base configuration.

8 Claims, 2 Drawing Sheets

UNILATERAL DIAC FOR MOTOR SPEED CONTROL

TECHNICAL FIELD

The invention herein resides in the art of phase control devices for use in AC powered systems. Particularly, the invention relates to a power phase control for hand tools and the like. More specifically, the invention relates to a unilateral diac operative to gate a silicone controlled rectifier (SCR), such diac obviating the need for a clamping diode across a timing capacitor.

BACKGROUND ART

It has previously been known to employ a silicone controlled rectifier (SCR) in speed control circuits for AC motors. Particularly, it has been common to use such a device in hand tools and the like where speed control is desired. A diac, interconnected to the gate of the SCR, is typically controlled by a charging circuit to provide power phase control to the motor.

The structure of the prior art control circuitry is shown in FIG. 1, where a speed control circuit is designated generally by the numeral 10. As shown, an AC power source 12 is adapted for interconnection with a motor 14 having an SCR 16 interconnected therewith. The gate of the SCR 16 is connected to a diac 18 which is then operative to gate the SCR 16 into conduction at determinable times on alternating half cycles of the AC power source 12. The time at which such conduction commences is determined by a timing circuit comprising a resistor 20, in series connection with a variable resistor 22, which is adjustable by an operator through a trigger switch or the like of the associated hand tool. As shown, the resistors 20, 22 interconnect the power source 12 with a charging capacitor 24. On alternating half cycles of the AC power source 12, the capacitor 24 charges through the resistors 20, 22 to a characteristic breakdown level of the diac 18 which then conducts to actuate the SCR 16 through its gate. The time constant of the RC circuit comprising resistors 20, 22 and capacitor 24 controls the phase angle of actuation of the SCR 16 on the conduction half cycles.

In the prior art, a clamping diode 26 has been required across the capacitor 24 for smooth control of motor operation. The diode 26 clamps the capacitor on each non-conducting half cycle to assure smooth control and low voltage start up when used with universal motors and other loads.

In the past, diacs have been found to be leaky, not given to repeatability in operation. Typically, such diacs are of an NPN construction, wherein the leakage paths in the diac are resistive paths between the layer interfaces from a surface or contact area to the base region of P material. It is most desirable in the art to eliminate the leakiness in the diacs to make the same more reliable and repeatable in operation. It is further desirable to eliminate the need for a clamping diode while still assuring smooth motor control and operation.

DISCLOSURE OF INVENTION

In light of the foregoing, it is a first aspect of the invention to provide a unilateral diac for motor speed control which is reliable and repeatable in operation.

Another aspect of the invention is the provision of a unilateral diac for motor speed control which acts like a diac in one direction and a zener diode in an opposite direction of operation.

Still a further aspect of the invention is the provision of a unilateral diac for motor speed control which allows for the elimination of a clamping diode in the diac-SCR circuit.

An additional aspect of the invention is the provision of a unilateral diac for motor speed control which is purposely configured to be leaky in one direction of operation.

A further aspect of the invention is the provision of a unilateral diac for motor speed control which may be readily constructed with state of the art materials and techniques.

The foregoing and other aspects of the invention which will become apparent as the detailed description proceeds are achieved by a power phase control circuit for a hand tool, comprising: a motor; an SCR connected to said motor; a diac connected to said SCR, said diac having a base of P material interposed between first and second emitters of N material, an interface between said base and first emitter being of different configuration from an interface between said base and second emitter; and a charging circuit interconnected with said diac, said charging circuit having an operator regulatable time constant associated therewith.

Additional aspects of the invention are attained by a power phase control circuit for an AC powered hand tool, comprising: a motor; an SCR connected to said motor; a diac connected to said SCR, said diac having a base interposed between first and second emitters, said base and first emitter having a planar interface and said base and second emitter having an interface comprising a cylinder received within an annulus; and a charging circuit interconnected with said diac, said charging surface comprising a variable resistor and a capacitor, and being absent any clamping diode interconnected with said capacitor.

DESCRIPTION OF DRAWINGS

For a complete understanding of the objects, techniques, and structure of the invention, reference should be made to the following detailed description and accompanying drawings wherein.

BEST MODE FOR CARRYING OUT THE INVENTION

Figure 1:
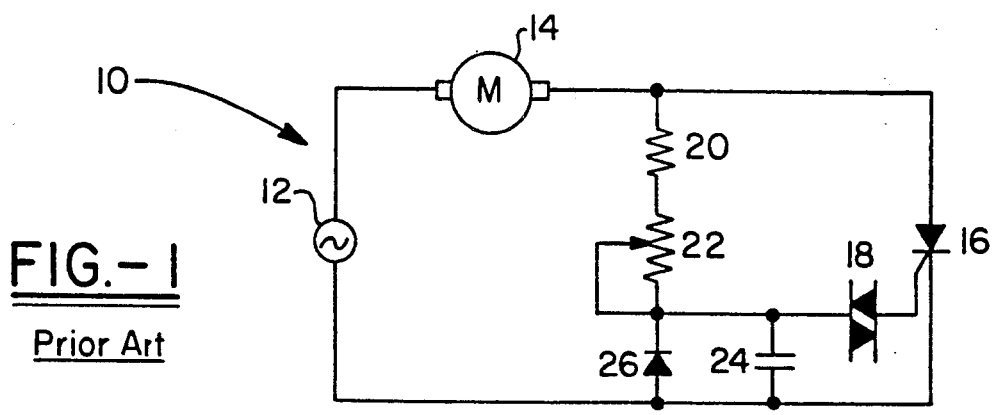
FIG. 1 is a schematic diagram of a prior art phase control circuit for hand tool motor control.
Figure 2A:
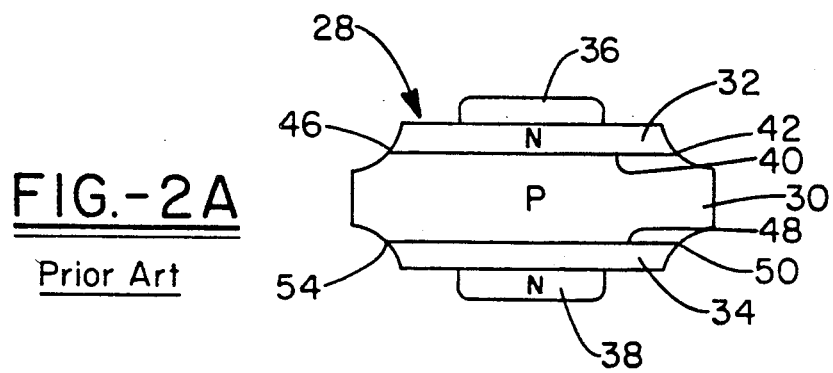
FIG. 2A is a front elevational view of a prior art diac.
Figure 2B:
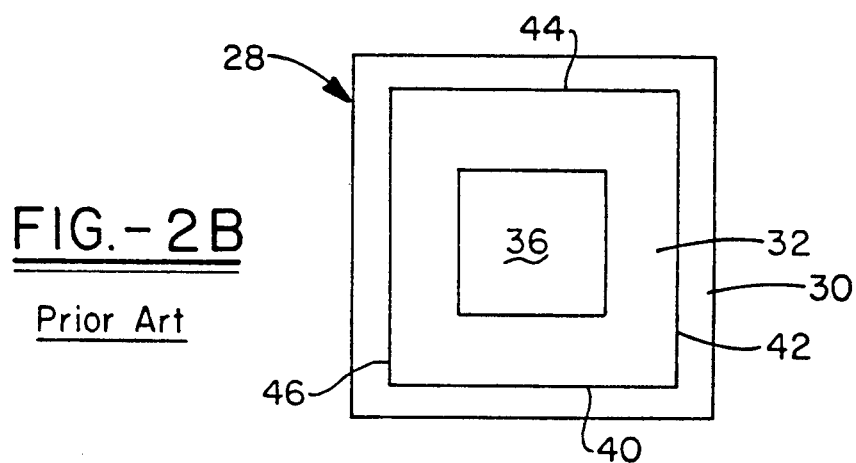
FIG. 2B is a top plan view of the prior art diac of FIG. 2A.

Referring again to the drawings and more particularly FIGS. 2A and 2B, it can be seen that an NPN diac of the prior art is designated generally by the numeral 28. Those skilled in the art will appreciate that the base 30 of the diac 28 comprises a layer of P-type material sandwiched between emitters 32, 34, each comprised of N-type material. Contact pads 36, 38 are connected to the respective emitters 32, 34 to provide means for interconnection with other circuit elements through lead wires and the like. Active junctions 40-46 are defined at the points of interconnection of the base 30 and emitter 32, while similar and corresponding active junctions 48-54 are defined at the interconnections between the base 30 and the emitter 34. It will, of course, be appreciated that a fourth active junction between the base 30 and emitter 34, corresponding to the junction 44, would also be present, but is not shown in the view of the drawings. Those skilled in the art will also readily appreciate that the characteristic breakdown voltage and the operational characteristics of the diac are typically a function of the interface and interconnection of the emitters 32, 34 with the base 30.

Figure 3:
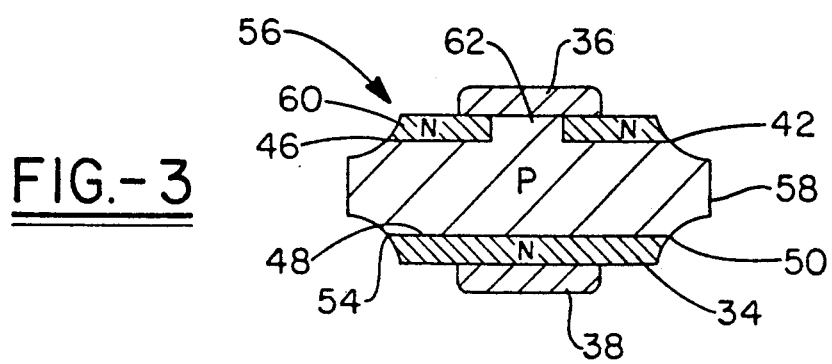
FIG. 3 is a cross sectional view of a unilateral diac according to the invention.

With reference now to FIG. 3, it can be seen that a unilateral diac according to the invention is designated generally by the numeral 56. Here, a base 58 of P-type material is interposed between an emitter 34 and the emitter 60, also of N-type material. It will be appreciated that the emitter 34 is plate like, as in the prior art, but that the emitter 60 comprises an annular plate having an annulus to receive a cylinder 62 of the base 58 therein. The contact pad 36 bridges the annulus of the emitter plate 60, making contact with the cylinder 62 of the base 58 and with the emitter 60 about the circumference of the annulus. It will be appreciated that the cylinder 62 received by the annular emitter 60, and making common contact with the contact pad 36, provides for a short circuit thereat, or a shorted base configuration.

Those skilled in the art will readily recognize that the diac 56 is intentionally leaky in one direction as a result of the resistive path provided by the short discussed above. It has been found that when the contact pad 38 is positive with respect to the contact pad 36, the diac 56 operates in standard fashion as a diac having a characteristic avalanche negative breakdown voltage at the planar PN junction or interface between the emitter 34 and base 58. However, when the contact pad 36 is positive with respect to the contact pad 38, the unilateral diac 56 operates as a zener diode. The built in resistance achieved by the shorted base construction provides for base emitter drive between the base 58 and emitter 60 at low currents to partially turn on the diac 56 into conduction. As this current increases, the shorted base region becomes ineffective and, at a zener voltage, breakdown occurs and the unilateral diac 56 operates as a zener diode. The characteristic voltage of the effective zener diode has been found to be a function of the impurity concentration of cylinder 62 and the geometric configuration and size of the annulus of the emitter plate 60 and the cylinder 62 of the base 58.

Figure 4:
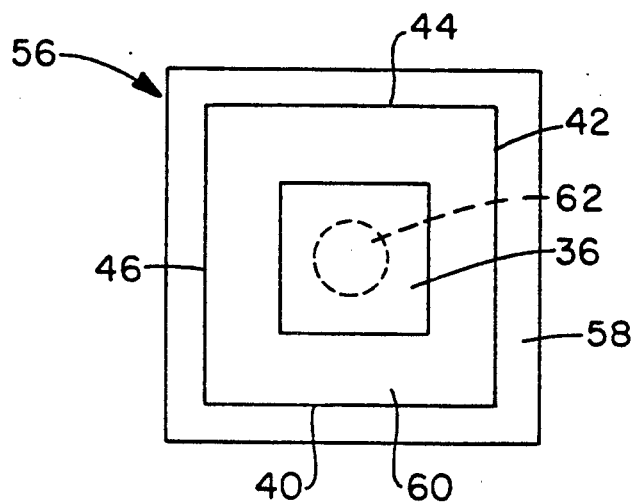
FIG. 4 is a top plan view of the universal diac of FIG. 3.

As best shown in FIG. 4, the external physical configuration of the diac 56 remains similar to the prior art diac 28, with similar active junctions 40-46 and 48-54 as discussed above. The emitters 34, 60 remain substantially planar, the principal difference between the emitter 60 and the emitter 32 of the prior art being the annulus provided in the emitter 60 for receipt of the cylinder 62. In like manner, the base 58 differs from the base 30 of the prior art by the presence of such cylinder 62. Apart from these differences, the diac 56 is substantially identical to the diac 28, with the interfaces between the emitters 34, 60 and the base 58 being substantially planar except for the presence of the cylinder 62 within the annulus of the plate 60.

Figure 5:
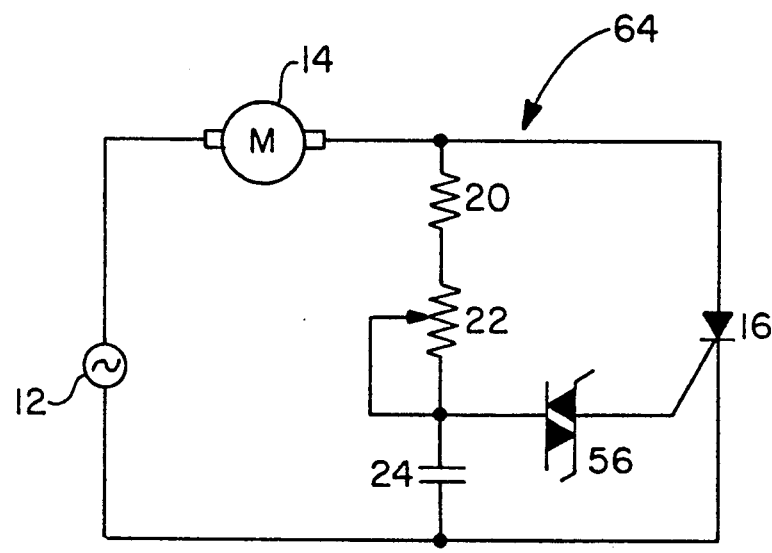
FIG. 5 is a power phase control circuit according to the invention and employing the novel unilateral diac thereof.

With reference now to FIG. 5, it can be seen that the universal diac 56 may be employed in a speed control circuit 64 which is substantially identical to the speed control circuit 10, but for the elimination of the clamping diode 26 positioned in shunt across the charging capacitor 24 in the prior art embodiment of the circuit 10. The implementation of the universal diac 56, operating as a diac in one direction and as a zener diode in the reverse direction, allows for the elimination of the clamping diode 26. The utilization of the unilateral diac 56 allows for effective and reliable control of the SCR 16, clamping the nonconductive half cycle of the power output source 12 in the same manner as the diode 26 of the prior art, giving smooth control and low voltage start up capabilities with the motor 14.

It has been found in one embodiment of the universal diac 56 that in operation as a diac, the breakdown voltage was reliably and consistently achieved at 32 volts, while in the reverse direction the zener breakdown voltage was reliably and consistently achieved at approximately 20 volts. Accordingly, when connected as a diac to control the SCR 16, once the capacitor 24 has charged to 32 volts, the diac 56 conducts to gate the SCR 16 into conduction, the timing of such event being a function of the time constant of the RC circuit of the resistors 20, 22 and capacitor 24 as set by an operator through the viable resistor 22. In like manner, in the nonconducting half cycle, the zener characteristics of the universal diac 56 serve to clamp the capacitor 24.

Thus it can be seen that the objects of the invention have been satisfied by the structure presented above. A novel diac construction has been presented, functioning as a diac in one direction and as a zener diode in the opposite direction, the same being uniquely applicable to use in controlling an SCR in a motor control circuit. While in accordance with the patent statutes, only the best mode and preferred embodiment of the invention has been presented and described in detail, it will be understood that the invention is not limited thereto or thereby. Accordingly, for an appreciation of the true scope and breadth of the invention reference should be made to the following claims.

What is claimed is:

1. A power phase control circuit for a hand tool, comprising:

a motor;

an SCR connected to said motor;

a diac connected to said SCR, said diac having a base of P-type material interposed between first and second emitters of N-type material, an interface between said base and first emitter being of different configuration from an interface between said base and second emitter; and a charging circuit interconnected with said diac, said charging circuit having an operator regulatable time constant associated therewith, and wherein said first emitter comprises an annular plate and said interface between said second emitter and said base is substantially planar.

2. The power phase control circuit according to claim 1, wherein said base is substantially plate-like, charging a cylindrical extension received by an annulus of said annular plate.

3. The power phase control circuit according to claim 2, wherein said diac further comprises a control pad bridging said annulus and interconnecting said cylindrical extension of said base and said first emitter.

4. The power phase control circuit according to claim 3, wherein said charging circuit comprises a capacitor interconnected with a variable resistor.

5. The power phase control circuit according to claim 4, wherein said capacitor is not shunted by a clamping diode.

6. A power phase circuit for an AC powered hand tool, comprising:
   a motor;
   an SCR connected to said motor;
   a diac connected to said SCR, said diac having a base interposed between first and second emitters, said base and first emitter having a planar interface and said base and second emitter having an interface comprising a cylinder received within an annulus; and
   a charging circuit interconnected with said diac, said charging circuit comprising a variable resistor and a capacitor, and being absent any clamping diode interconnected with said capacitor.

7. The power phase control circuit according to claim 6, further comprising a control pad bridgingly interconnecting said base and said second emitter at said cylinder and annulus.

8. The power phase control circuit according to claim 7, wherein said planar interface between said base and first emitter is substantially continuous and uniform.

* * * * *